United States Patent [19]

Ikeda et al.

[11] Patent Number: 5,101,242
[45] Date of Patent: Mar. 31, 1992

[54] THIN FILM TRANSISTOR

[75] Inventors: Hiroyuki Ikeda, Yokohama; Osamu Shimada, Kawasaki; Teruo Uchida, Sagamihara; Takahiro Murakami, Kusatsu, all of Japan

[73] Assignee: International Business Machines Corporation, Armonk, N.Y.

[21] Appl. No.: 481,255

[22] Filed: Feb. 20, 1990

[30] Foreign Application Priority Data

Feb. 17, 1989 [JP] Japan ................................ 1-38069

[51] Int. Cl.[5] .................................... H01L 27/12
[52] U.S. Cl. .................................. 357/4; 357/23.7
[58] Field of Search ................. 357/4, 23.7, 2

[56] References Cited

FOREIGN PATENT DOCUMENTS

| | | | |
|---|---|---|---|
| 59-14675 | 1/1984 | Japan | 357/4 |
| 60-66864 | 4/1985 | Japan | 357/4 |
| 61-32471 | 2/1986 | Japan | 357/4 |
| 61-87371 | 5/1986 | Japan | 357/4 |
| 61-89672 | 5/1986 | Japan | 357/4 |
| 61-220369 | 9/1986 | Japan | 357/4 |

OTHER PUBLICATIONS

An Amorphous SiC:H Emitter Heterojunction Bitransistor Sasouki et al. IEEE vol. EDL-6 No. 6 Jun. 1985.

Primary Examiner—Bruce Y. Arnold
Assistant Examiner—Hung Dang
Attorney, Agent, or Firm—Robert M. Trepp

[57] ABSTRACT

A thin film transistor is described incorporating a gate electrode, a layer of insulating material, a layer of buffer material, a layer of semiconductor material, a source electrode and drain electrode. The invention reduces the problem of variation in threshold voltage of thin film transistors due to external stress such as the gate voltage or temperature.

5 Claims, 3 Drawing Sheets

THIN FILM TRANSISTOR

BACKGROUND OF THE INVENTION

1. Field of the Invention

This invention relates to semiconductor devices and more particularly to thin film transistors.

2. Description of the Prior Art

FIG. 5 shows a cross section of an example of a conventional amorphous silicon thin film transistor. A transparent insulating substrate 21 is provided thereon with a gate electrode 22 using chrome (Cr), and a gate insulating layer 23 that consists of silicon nitride formed by a plasma CVD process. A semiconductor layer 24 using amorphous silicon is formed on the gate insulating layer 23, and a source electrode 25 and a drain electrode 26 are formed by depositing and etching aluminum (Al).

FIG. 6 shows the electrical characteristics of the conventional amorphous silicon thin film transistor shown in FIG. 5. The curve (1) of FIG. 6 shows the drain current-gate voltage ($I_d-V_g$) characteristics at an initial state where the voltage between the source and the drain ($V_{sd}$) was set for 10 volts. The threshold voltage ($V_{th}$) at the moment was 1.2 volts. The curve (2) of FIG. 6 shows the $I_d-V_g$ characteristics after applying +25 volts to the gate voltage of this amorphous silicon thin film transistor with constant source-drain voltage ($V_{sd}$)=10 volts, leaving it for 96 hours. The curve (3) of FIG. 6 similarly shows the $I_d-V_g$ characteristics after applying −10 volts to the gate voltage and leaving for 96 hours. The threshold voltage of the curves (2) and (3) of FIG. 6 is 2.1 and −0.3 volts, respectively.

As seen from FIG. 6, in the conventional amorphous silicon thin film transistor with the structure of FIG. 5, the threshold voltage ($V_{th}$) shifts in the positive direction when a positive potential is applied to the gate voltage and left, and in the negative direction when a negative potential is applied and left. The amount of the shift is particularly significant in the positive direction. The variation of the threshold voltage ($V_{th}$) appears to be caused by the fact that electric charges are implanted in the gate insulating layer 23.

Also, a similar variation of the threshold voltage ($V_{th}$) is observed on the conventional amorphous silicon thin film transistor for temperature change. The charge implanted into the gate insulating layer 23, which appears to be the cause of those variations of the threshold voltage ($V_{th}$), is caused by the gate voltage and the source voltage/current, but mainly by the gate voltage.

As described, the variation of the threshold voltage ($V_{th}$) of the conventional amorphous silicon thin film transistor is very sensitive to external stress such as the gate voltage and temperature, which causes a very significant problem in stable operation and reliability.

SUMMARY OF THE INVENTION

In accordance with the present invention, a thin film transistor having a stable threshold voltage is provided comprising a gate electrode, a gate insulating layer, a semiconductor layer, a buffer layer provided between the gate insulating layer and the semiconductor layer, a source electrode, and a drain electrode, wherein the energy band gap width of the buffer layer is wider than that of the energy band gap width of the semiconductor layer.

The invention further provides a thin film transistor having a stable threshold voltage comprising a gate electrode, a gate insulating layer, a semiconductor layer, a buffer layer provided between the gate insulating layer and the semiconductor layer, a source electrode, and a drain electrode, wherein the carrier density of the buffer layer is denser than that of the semiconductor layer.

It is an object of the invention to provide a thin film transistor exhibiting high reliability and high performance while holding the variation of its threshold voltage at the minimum level.

It is a further object of the invention to provide a buffer layer consisting mainly of silicon.

It is a further object of the invention to provide a buffer layer divided into two sections, a source section and a drain section.

It is further object of the invention to provide a semiconductor layer including an amorphous silicon layer.

Thus, according to the invention, provision of the buffer layer between the gate insulating layer and the semiconductor layer enables the aging variation of the threshold voltage ($V_{th}$) to be decreased, and the variations of the threshold voltage ($V_{th}$) within each production lot not to be suppressed.

When the buffer layer has a higher carrier density, it may become a path of source-drain current, so that the buffer layer with high carrier density is separated into a source section and a drain section. In this case, a symmetrical arrangement is employed in which the gate electrode is positioned on one side of the gate insulating layer and the buffer layer of high carrier density is positioned on the other side of the gate insulating layer, while the buffer layer is positioned on one side of the semiconductor layer and the source and the drain electrodes are positioned on the other side of the semiconductor layer.

This symmetry and the high carrier density in the buffer layer enables the aging variation of the threshold voltage to be suppressed and a high ON current between the source and the drain to be obtained because carriers are previously dispersed in the insulating layer.

DESCRIPTION OF THE PREFERRED EMBODIMENTS

Figure 1:
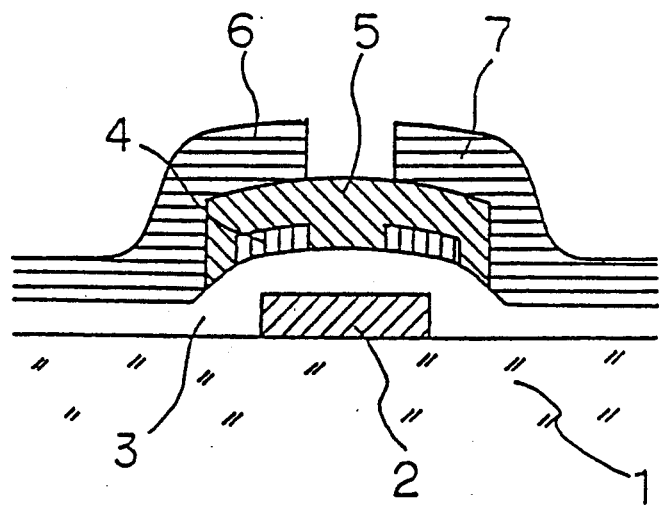
FIG. 1 is a cross section view of a thin film transistor according to a first embodiment.

Referring to the drawings, FIG. 1 shows a cross section view of a thin film transistor according to a first embodiment.

The thin film transistor according to this embodiment comprises a gate electrode 2, a gate insulating layer 3, a semiconductor layer 5, a buffer layer 4 provided between the gate insulating layer 3 and the semiconductor layer 5, a source electrode 6, and a drain electrode 7.

The gate electrode 2 is formed by chromium (Cr) in a thickness of 3,000 angstroms on a transparent insulating substrate 1 consisting of glass. A gate insulating layer 3 is formed on the gate electrode 2 by a silicon oxide film (SiO$_x$) in a thickness of 1,000 angstroms. Then, the buffer layer 4 is formed by silicon carbide (SiC) in a thickness of 300 angstroms.

On the buffer layer 4, the semiconductor layer 5 is formed by a phosphor doped amorphous silicon (n$^+$—a—Si) and an amorphous silicon film (a—Si) in a thickness of 2,000 angstroms, and the source electrode 6 and the drain electrode 7 are formed by aluminum (Al).

The buffer layer 4 serves to reduce the change of the amount of effective charge induced on the surface of the semiconductor 5, and, in this embodiment, is formed by a material with a wider energy band gap width than that of the semiconductor layer 5, while the buffer layer (14) of a second invention, as described later, is formed by a material with higher carrier density than that of the semiconductor layer (15).

Here, channel width/channel length=40 μm/10 μm.

Because, in the arrangement as described above, the buffer layer 4 prevents the reduction of the effective charge in the semiconductor layer 5, the aging variation of the threshold voltage is suppressed.

The thin film transistor of the above embodiment was subjected to the BT (bias temperature) process in a constant temperature over at 80° C. under two conditions of the gate voltage at $-10$ V and $+25$ V, and checked for the aging variation ($\Delta V_{th}$) of the threshold voltage ($V_{th}$) while comparing with a thin film transistor of a conventional structure without the buffer layer 4. It was found that the variation ($\Delta V_{th}$) of the thin film transistor of the embodiment was suppressed at one half or less than that of the conventional thin film transistor.

The variation of the threshold voltage ($V_{th}$) seems to be caused by the fact that the electric charge flowing into the insulating layer or captured in an interface causes a change in the amount of the effective charge induced in the surface of the semiconductor layer. Such variation of the threshold voltage ($V_{th}$) is particularly significant when the semiconductor layer consists of amorphous material. Suppressing of the variation is also important because the amorphous semiconductor is widely used.

The buffer layer contributes to reduce the change of the amount of effective charge induced in the surface of the semiconductor. That is, the buffer layer in place of the semiconductor layer interacts with the insulating layer so as to prevent the effective charge in the semiconductor layer from being reduced. The buffer layers which function in the above manner are a buffer layer whose band gap width is wider than that of the semiconductor layer, and a buffer layer whose carrier density is denser than that of the semiconductor layer.

Figure 2:
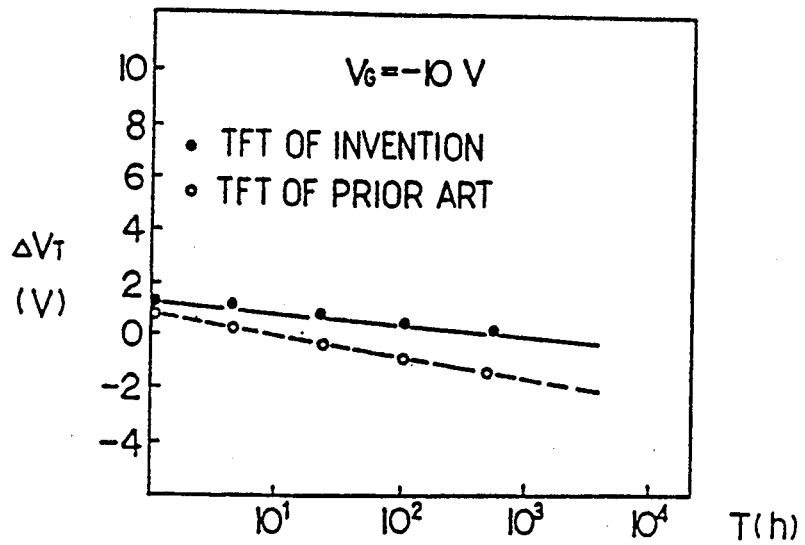
FIGS. 2 and 3 are graphs showing aging variation of the threshold voltage in the thin film transistor shown in FIG. 1.
Figure 3:
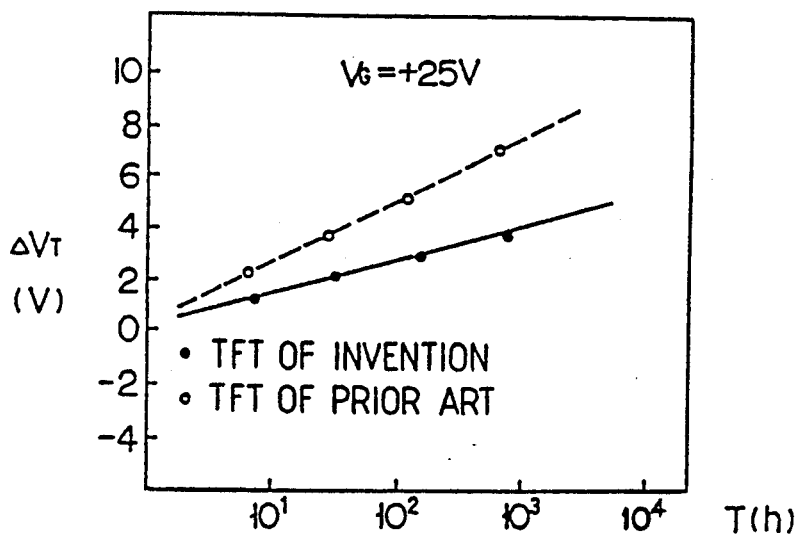
Figure 5:
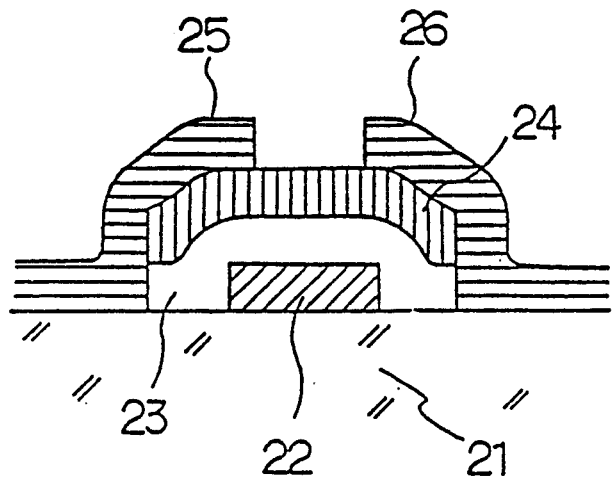
FIG. 5 is a cross section view of an example of a conventional amorphous silicon thin film transistor.
Figure 6:
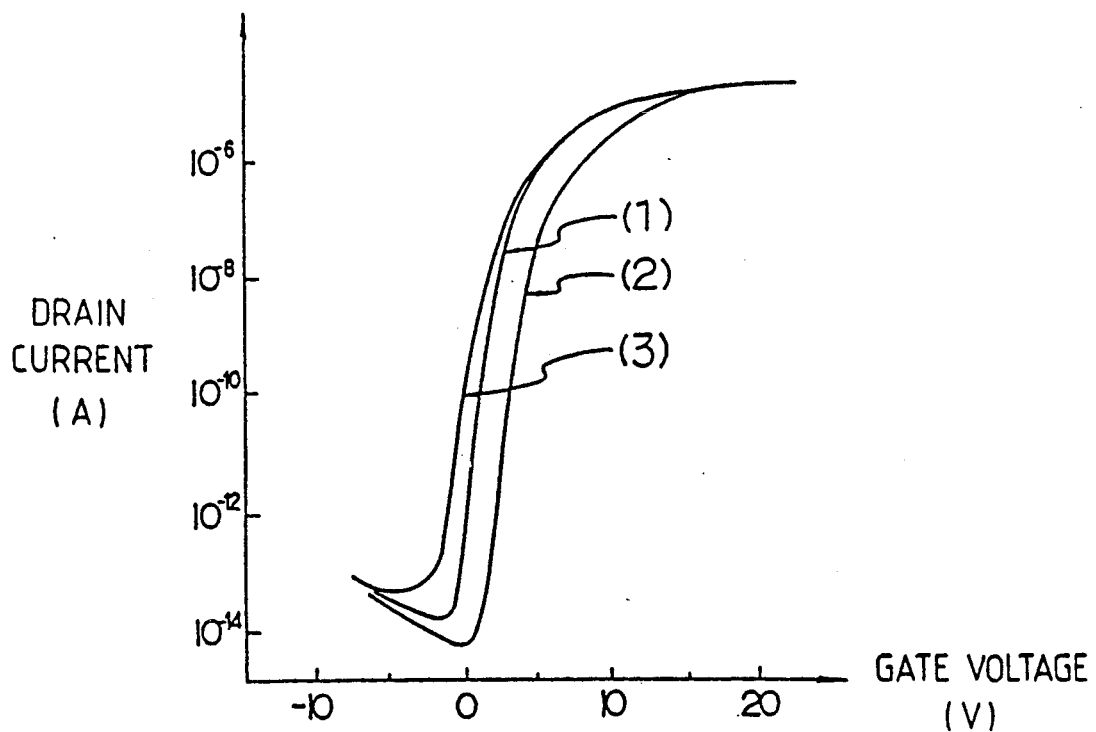
FIG. 6 is a graph showing the drain current-gate voltage characteristics of a thin film transistor with a conventional structure.

FIGS. 2 and 3 show diagrams of aging variation of the threshold voltage. In the FIGURES, the solid line shows the aging of the thin film transistor according to the invention, while the broken line shows the aging of the thin film transistor with the conventional structure shown in FIG. 5. From the FIGURES, it will be understood that the variation ($\Delta V_{th}$) of the thin film transistor according to the embodiment is suppressed at one half or less than that of the conventional thin film transistor.

In addition, when the ON current between the source and the drain was checked, it was found that the thin film transistor of the embodiment has an ON current several times greater than that of the conventional thin film transistor.

Figure 4:
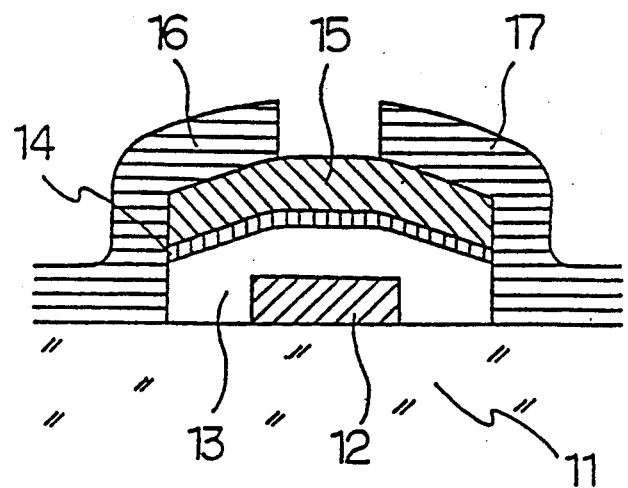
FIG. 4 is a cross section view of a thin film transistor according to a second embodiment.

FIG. 4 shows a cross section of a thin film transistor according to a second embodiment.

The thin film transistor according to this embodiment consists of a gate electrode 12, a gate insulating layer 13, a semiconductor layer 15, a buffer layer 14 provided between the gate insulating layer 13 and the semiconductor layer 15, a source electrode 16, and a drain electrode 17.

The gate electrode 12 is formed by chromium (Cr) in a thickness of 3,000 angstroms on an insulating substrate 11 which may be transparent, for example, glass. A gate insulating layer 13 is formed on the gate electrode 12 by a silicon nitride film in a thickness of 2,000 angstroms. After the gate insulating layer 13 is formed, the buffer layer 14 is formed by molybdenum (Mo) with a thickness of 300 angstroms followed by a little etching of the surface by a sputtering device. In addition, the buffer layer 14 may be formed by separating into two sections, a section below the source electrode 16 and a section below the drain electrode 17.

After the a little etching of the surface, the semiconductor layer 15 is formed on the buffer layer 14 by a phosphor doped amorphous silicon (n$^+$—a—Si) and an amorphous silicon film (a—Si) in a thickness of 2,000 angstroms. The source electrode 16 and the drain electrode 17 are also formed on it by aluminum (Al).

The buffer layer 14 serves to reduce the change of the amount of effective charge induced on the surface of the semiconductor layer 15. That is, the buffer layer 14 in place of the semiconductor layer 15 interacts with the insulating layer 13 so as to prevent the effective charge in the semiconductor layer 15 from being reduced by the insulating layer. To this end, as described above, the buffer layer 14 is formed by a material having a higher carrier density than that of the semiconductor layer 15.

Furthermore, the buffer layer 14 may become a path of source-drain current, so that the buffer layer with high carrier density is separated into a section below or under the source electrode 16 and a section below or under the drain electrode 17 as shown in FIG. 1. Then, as shown in FIGS. 1 or 4, a symmetrical arrangement is employed in which the gate electrode 12 is positioned on one side of the gate insulating layer 13 and the buffer layer 14 is positioned on the other side of the gate insulating layer 13, while the buffer layer 14 is positioned on one side of the semiconductor layer 15 and the source electrode 16 and the drain electrode 17 are positioned on the other side of the semiconductor layer 15.

In FIGS. 1 and 4, channel width/channel length=40 μm/10 μm.

In the above arrangement as shown in FIGS. 1 and 4, because carriers are previously dispersed in the buffer layer 14, the aging variation of the threshold voltage is suppressed, and high current can be obtained between the source and the drain.

As described, the invention provides a thin film transistor that can reduce the aging variation of the threshold voltage, and can be stably driven by making the energy band gap width of the buffer provided between the gate insulating layer and the semiconductor layer wider than that of the semiconductor layer, or by making the carrier density of the buffer layer higher that of the semiconductor layer.

In addition, higher ON current between the source and the drain can be obtained by making the carrier density of the buffer layer higher than that of the semiconductor layer, and by separating the buffer layer into two spaced apart sections, the source section and the drain section.

We claim:

1. A thin film transistor comprising a gate electrode, a gate insulating layer, a semiconductor layer, a buffer layer provided between the gate insulating layer and the semiconductor layer, a source electrode, and a drain electrode, wherein the energy band gap width of said buffer layer is wider than that of said semiconductor layer.

2. The thin film transistor of claim 1, wherein said buffer layer consists mainly of silicon carbide.

3. The thin film transistor of claim 1, wherein said semiconductor layer includes an amorphous silicon layer.

4. The thin film transistor of claim 1, wherein said buffer layer has at least two section, each said section spaced apart from other said sections.

5. A thin film transistor comprising a gate electrode, a first layer of insulating material deposited over said gate electrode, a second layer of buffer material deposited over said first layer, a third layer of semiconductor material deposited over said second layer, a source electrode positioned on said third layer, and a drain electrode spaced apart from said source electrode and positioned on said third layer, said buffer material having an energy band gap width wider than the energy band gap width of said semiconductor material.

* * * * *